(12) United States Patent
Albrecht

(10) Patent No.: US 9,419,609 B2
(45) Date of Patent: Aug. 16, 2016

(54) BRIDGE CIRCUIT WITH IMPROVED FAIL-SAFETY

(71) Applicant: Micronas GmbH, Freiburg (DE)

(72) Inventor: Stefan Albrecht, Mauchenheim (DE)

(73) Assignee: Micronas GmbH, Freiburg (DE)

( * ) Notice: Subject to any disclaimer, the term of this patent is extended or adjusted under 35 U.S.C. 154(b) by 401 days.

(21) Appl. No.: 14/084,263

(22) Filed: Nov. 19, 2013

(65) Prior Publication Data

US 2014/0139044 A1    May 22, 2014

(30) Foreign Application Priority Data

Nov. 19, 2012 (DE) .......................... 10 2012 022 495

(51) Int. Cl.
*H03K 17/687* (2006.01)
*H01H 9/54* (2006.01)

(52) U.S. Cl.
CPC .... *H03K 17/6871* (2013.01); *H03K 2217/0045* (2013.01); *Y10T 307/747* (2015.04)

(58) Field of Classification Search
CPC ....................................................... H01H 9/54
USPC .......................................................... 307/115
See application file for complete search history.

(56) References Cited

U.S. PATENT DOCUMENTS

| | | | |
|---|---|---|---|
| 2,625,458 A | 1/1953 | Ruhland | |
| 4,691,270 A * | 9/1987 | Pruitt | ...................... H02M 1/34 363/132 |
| 7,629,718 B2 | 12/2009 | Gruendel et al. | |
| 7,768,317 B1 | 8/2010 | Dhaoui et al. | |
| 2005/0281065 A1 | 12/2005 | Nojima | |
| 2009/0146595 A1 | 6/2009 | Immler | |
| 2010/0110742 A1 * | 5/2010 | West | ......................... H02H 3/16 363/132 |
| 2011/0266986 A1 | 11/2011 | Christmann | |

FOREIGN PATENT DOCUMENTS

| | | |
|---|---|---|
| DE | 10 2005 044 526 A1 | 3/2007 |
| DE | 10 2006 012 215 A1 | 9/2007 |
| DE | 10 2007 060 380 A1 | 6/2008 |
| DE | 10 2007 063 434 A1 | 1/2009 |
| DE | 10 2007 044 226 A1 | 3/2009 |
| DE | 10 2009 004 556 A1 | 7/2010 |
| EP | 1 764 907 A1 | 3/2007 |

OTHER PUBLICATIONS

Switch Logic Circuits.*
Ambusaidi et al., "New Circuit Topology for Fault Tolerant H-Bridge DC-DC Converter," IEEE Trans. on Power Elec., vol. 25, No. 6, pp. 1509-1516 (Jun. 2010).
Xiao et al., "Seven-Level Shunt Active Power Filter for High-Power Drive Systems," IEEE Trans. on Power Elec., vol. 24, No. 1, pp. 6-13 (Jan. 2009).

* cited by examiner

*Primary Examiner* — Robert Deberadinis
(74) *Attorney, Agent, or Firm* — Muncy, Geissler, Olds & Lowe, P.C.

(57) ABSTRACT

A bridge circuit with improved fail-safety, having a first electrical load with a first contact terminal and a second contact terminal, and a first series circuit connected to a first node and to a second node. A second series circuit is connected to a third node and to a fourth node. A third series circuit is connected to the second node and to a fifth node. A fourth series circuit is connected to the fourth node and to a sixth node. The first node and the third node are connected to a supply voltage, and the fifth node and the sixth node are connected to a reference voltage, and the first contact terminal is connected to the second node and the second contact terminal is connected to the fourth node.

7 Claims, 2 Drawing Sheets

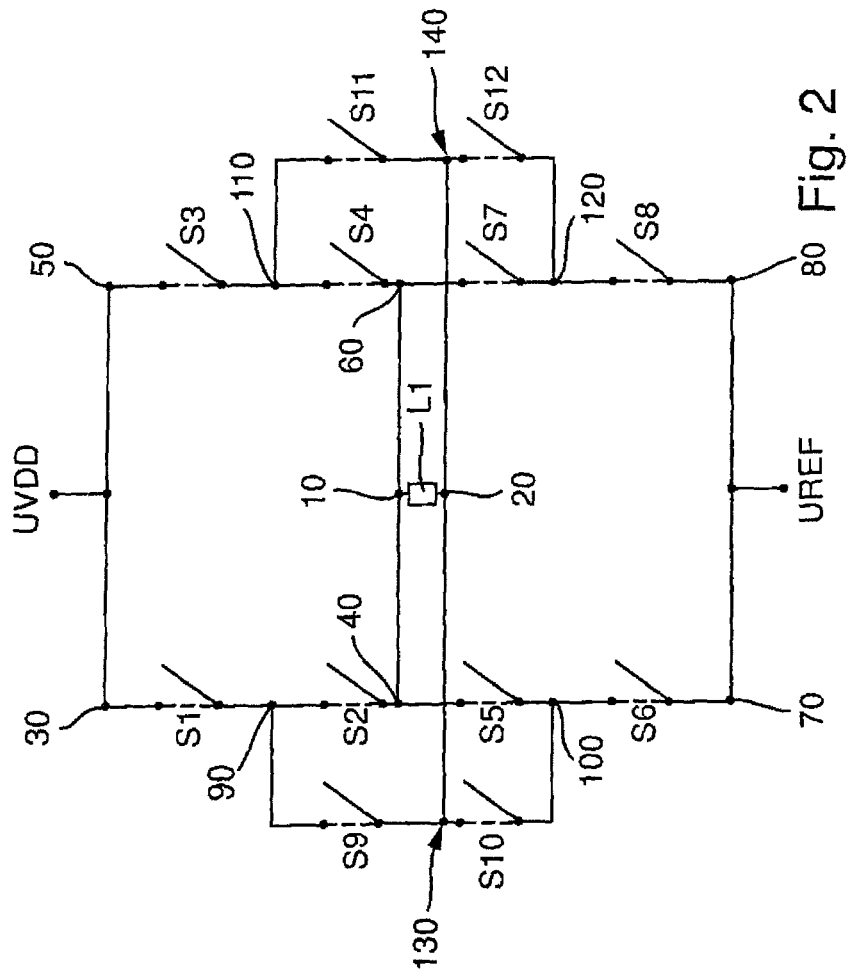
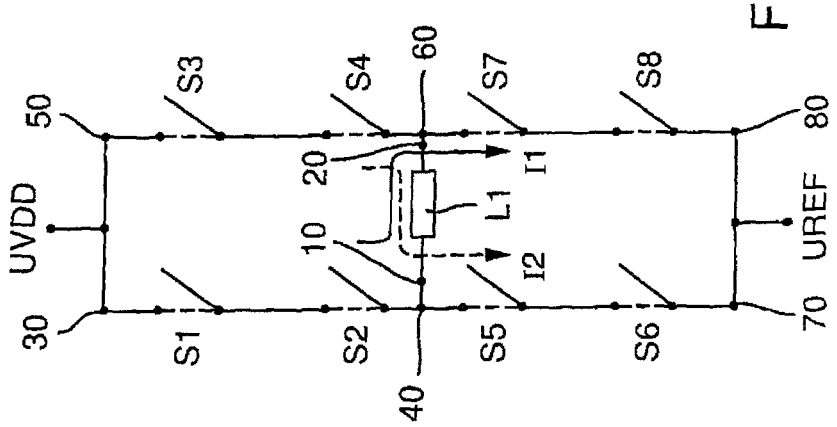

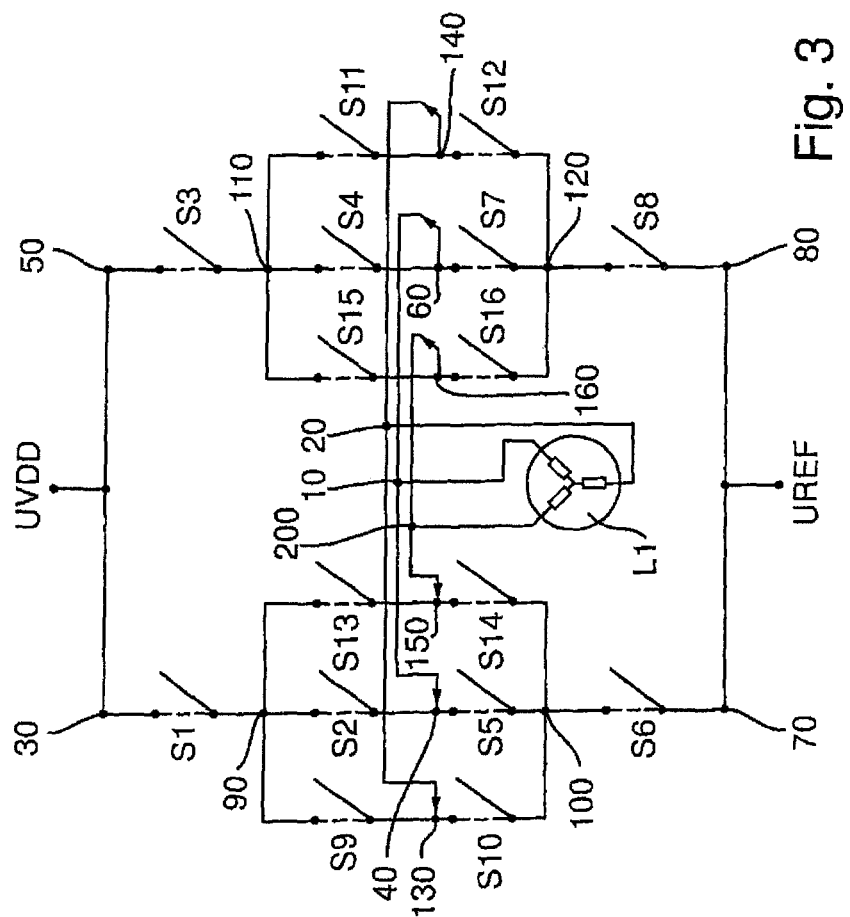

BRIDGE CIRCUIT WITH IMPROVED FAIL-SAFETY

This nonprovisional application claims priority under 35 U.S.C. §119(a) to German Patent Application No. DE 10 2012 022 495.8, which was filed in Germany on Nov. 19, 2012, and which is herein incorporated by reference.

BACKGROUND OF THE INVENTION

1. Field of the Invention

The present invention relates to a bridge circuit with improved fail-safety.

2. Description of the Background Art

A variety of bridge circuits, and in particular half bridges, are known from DE 10 2007 063 434 A1, DE 10 2007 060 380 B3, DE 10 2005 044 526 A1, EP 1 764 907 A1, and U.S. Pat. No. 2,625,458. In particular, the direction of current flow through an electrical load is changed using the bridge circuits. In this context, electric motors or inverters for solar technology, in particular, are an important area of application for such bridge circuits.

SUMMARY OF THE INVENTION

It is therefore an object of the present invention to provide a device that advances the state of the art.

According to an embodiment of the invention, a bridge circuit with improved fail-safety is provided, wherein the bridge circuit has a first electrical load with a first contact terminal and a second contact terminal, and a first series circuit with a first switch and with a second switch is additionally provided, wherein the first series circuit is connected to a first node and to a second node, and a second series circuit with a third switch and with a fourth switch is provided, and the second series circuit is connected to a third node and to a fourth node, and a third series circuit with a fifth switch and with a sixth switch is provided, and the third series circuit is connected to the second node and to a fifth node, and a fourth series circuit with a seventh switch and with an eighth switch is provided, wherein the fourth series circuit is connected to the fourth node and to a sixth node, and wherein the first node and the third node are connected to a supply voltage, and the fifth node and the sixth node are connected to a reference voltage, and the first contact terminal is connected to the second node and the second contact terminal is connected to the fourth node. It should be noted that the term integrated bridge circuit is understood to mean a bridge circuit whose switches are implemented as integrated components in a semiconductor device. Preferably, the switches here are implemented as MOS switches and are implemented in a common housing. Integrated bridge circuits of this type are used, in particular, for switching high currents. In the present case, the term high currents can be understood to mean currents above one ampere, most preferably currents above 10 amperes. Moreover, it is noted that in each branch of the bridge circuit, on both the supply voltage side and the ground side, two switches are connected in series in the relevant branch. Moreover, it is noted that the term "connected" is understood to mean a low-resistance connection between two points in the circuit. A low-resistance connection here is understood to mean a connection with a resistance below 10 ohms. Such low-resistance connections can also be viewed as short circuits.

According to an embodiment of the invention, a bridge circuit with improved fail-safety is provided, wherein the bridge circuit has a first electrical load with a first contact terminal and a second contact terminal, and the bridge circuit includes a first series circuit with a first switch and with a second switch, wherein the first series circuit is connected to a first node and to a second node, and the bridge circuit includes a second series circuit with a third switch and with a fourth switch, wherein the second series circuit is connected to a third node and to a fourth node, and a third series circuit with a fifth switch and with a sixth switch is also provided, wherein the third series circuit is connected to the second node and to a fifth node, and wherein a fourth series circuit with a seventh switch and with an eighth switch is provided, wherein the fourth series circuit is connected to the fourth node and to a sixth node, and wherein the first node and the third node are connected to a supply voltage, and the fifth node and the sixth node are connected to a reference voltage, wherein a fifth series circuit with a ninth switch and with a tenth switch is provided, and a sixth series circuit with an eleventh switch and with a twelfth switch is provided, and a seventh node is provided between the first switch and the sixth switch, and in addition an eighth node is provided between the fifth switch and the sixth switch, and a ninth node is provided between the third switch and the fourth switch, and in addition a tenth node is provided between the seventh switch and the eighth switch, and furthermore an eleventh node is provided between the ninth switch and the tenth switch, and a twelfth node is provided between the eleventh switch and the twelfth switch, wherein the eleventh node and the twelfth node are connected to one another, and the fifth series circuit is connected at one end to the node and at the opposite end to the node, and in addition the sixth series circuit is connected at one end to the node and at the opposite end to the node, and the first contact terminal is connected to the second node and the second contact terminal is connected to the eleventh node.

It is an advantage of the device according to the invention that a redundancy of the switches is present in every branch of the bridge circuit. Investigations have shown that switches with which high currents are switched, in particular, can no longer be opened after a certain period of time, in other words represent a short circuit. For example, in the very commonly used MOS semiconductor switches the fault in many cases is that the source-drain path is short-circuited. The probability of failure can be reduced by the means that two switches are present in series in every branch of the bridge circuit. Particularly for bridge circuits installed in systems that are difficult to access, improved fail-safety results in a considerable reduction in maintenance costs.

In one enhancement, a seventh series circuit with a thirteenth switch and with a fourteenth switch is provided, wherein a thirteenth node is located between the two switches of the seventh series circuit, and in addition an eighth series circuit with a fifteenth switch and with a sixteenth switch is provided, and a fourteenth node is located between the two switches of the eighth series circuit, and the seventh series circuit is connected at one end to the node and at the opposite end to the node, and the eighth series circuit is connected at one end to the node and at the opposite end to the node, and the thirteenth node and the fourteenth node are connected to one another, and wherein the load is connected to the thirteenth node.

In an embodiment, the load comprises a single-phase or three-phase device. Devices of this type preferably are designed as inductive loads, in particular as electric motors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows an embodiment of the integrated bridge circuit according to the invention;

FIG. 2 shows an embodiment of the integrated bridge circuit according to the invention; and FIG. 3 shows an embodiment of the integrated bridge circuit according to the invention.

DETAILED DESCRIPTION

The illustration in FIG. 1 shows an embodiment of an integrated bridge circuit with improved fail-safety according to the invention, having a first electrical load L1 with a first contact terminal 10 and a second contact terminal 20, and a first series circuit with a first switch S1 and with a second switch S2, wherein the first series circuit is connected to a first node 30 and to a second node 40, and in addition the integrated bridge circuit has a second series circuit with a third switch S3 and with a fourth switch S4, wherein the second series circuit is connected to a third node 50 and to a fourth node 60.

In addition, a third series circuit with a fifth switch S5 and with a sixth switch S6 is provided, wherein the third series circuit is connected to the second node 40 and to a fifth node 70. Moreover, a fourth series circuit with a seventh switch S7 and with an eighth switch S8 is provided, wherein the fourth series circuit is connected to the fourth node 60 and to a sixth node 80. Furthermore, the first node 30 and the third node 50 are connected to a supply voltage UVDD, and the fifth node 70 and the sixth node 80 are connected to a reference voltage UREF. Moreover, the first contact terminal 10 is connected to the second node 40 and the second contact terminal 20 is connected to the fourth node 60.

In a first state, a current I1 flows through the electrical load L1 when the first switch S1, the second switch S2, the third switch S3, and the fourth switch S4 are closed, and the third switch S3, the fourth switch S4, the fifth switch S5 and the sixth switch S6 are opened, and in a second state a current I2 flows accordingly when the first switch S1, the second switch S2, the third switch S3, and the fourth switch S4 are opened, and the third switch S3, the fourth switch S4, the fifth switch S5 and the sixth switch S6 are closed. Hence, the direction of current flow through the electrical load L1 can be changed in this way. If the load L1 is implemented as an inductive load in the form of an electric motor, for example, the direction of rotation of the single-phase motor can be changed by a change in the switch setting from the first state to the second state.

The illustration in FIG. 2 shows an embodiment of an integrated bridge circuit according to the invention. The differences from the embodiment shown in the illustration in FIG. 1 are explained below. The second node 40 is now connected to the fourth node 60. Furthermore, a fifth series circuit with a ninth switch S9 and with a tenth switch S10 is provided, as well as a sixth series circuit with an eleventh switch S11 and with a twelfth switch S12. Moreover, a seventh node 90 is provided between the first switch S1 and the sixth switch S6, and an eighth node 100 is provided between the fifth switch S5 and the sixth switch S6, and a ninth node 110 is provided between the third switch S3 and the fourth switch S4.

In addition, a tenth node 120 is provided between the seventh switch S7 and the eighth switch S8, and an eleventh node 130 is provided between the ninth switch S9 and the tenth switch S10. Furthermore, a twelfth node 140 is provided between the eleventh switch S11 and the twelfth switch S12, wherein the eleventh node 130 and the twelfth node 140 are connected to one another. The first contact terminal 10 of the first electrical load L1 is connected to the second node 40 and to the fourth node 60, and the second contact terminal 20 of the first electrical load is connected to the eleventh node 130 and to the twelfth node 140.

Consequently, the first switch S1, the third switch S3, the sixth switch S6, and the eighth switch S8 are each in series with one of the two branches of a half-bridge circuit. It is an advantage that even if any one switch in one of the two branches of the bridge circuit can no longer be opened, a further flow of current can be suppressed by opening the switch that is connected in series. The switch remains functional in this case.

The illustration in FIG. 3 shows an embodiment of an integrated bridge circuit according to the invention. The differences from the embodiment shown in the illustration in FIG. 2 are explained below. A seventh series circuit with a thirteenth switch S13 and with a fourteenth switch S14 is provided, and a thirteenth node 150 is located between the two switches S13, S14 of the seventh series circuit. In addition, an eighth series circuit with a fifteenth switch S15 and with a sixteenth switch S16 is provided, and a fourteenth node 160 is located between the two switches S15, S16 of the eighth series circuit. The seventh series circuit is connected at one end to the node 90 and at the opposite end to the node 100, and the eighth series circuit is connected at one end to the node 110 and at the opposite end to the node 120. In addition, the thirteenth node 150 and the fourteenth node 160 are connected to one another, wherein the load L1 has a third contact terminal 200 and is connected by the third contact terminal to the thirteenth node 150 and the fourteenth node 160.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A bridge circuit with an improved fail-safety, the bridge circuit comprising:
    a first electrical load with a first contact terminal and a second contact terminal;
    a first series circuit with a first switch and second switch, the first series circuit being connected to a first node and to a second node;
    a second series circuit with a third switch and a fourth switch, the second series circuit being connected to a third node and to a fourth node;
    a third series circuit with a fifth switch and a sixth switch, the third series circuit being connected to the second node and to a fifth node; and
    a fourth series circuit with a seventh switch and an eighth switch, the fourth series circuit being connected to the fourth node and to a sixth node, wherein the first node and the third node are connected to a supply voltage, wherein the fifth node and the sixth node are connected to a reference voltage, and wherein the first contact terminal is connected to the second node, and the second contact terminal is connected to the fourth node.

2. A bridge circuit with improved fail-safety, the bridge circuit comprising:
- a first electrical load with a first contact terminal and a second contact terminal;
- a first series circuit with a first switch and a second switch, the first series circuit being connected to a first node and to a second node;
- a second series circuit with a third switch and a fourth switch, the second series circuit being connected to a third node and to a fourth node;
- a third series circuit with a fifth switch and a sixth switch, the third series circuit being connected to the second node and to a fifth node;
- a fourth series circuit with a seventh switch and an eighth switch, the fourth series circuit being connected to the fourth node and to a sixth node; a fifth series circuit with a ninth switch and with a tenth switch;
- a sixth series circuit with an eleventh switch and a twelfth switch;
- a seventh node arranged between the first switch and the sixth switch;
- an eighth node arranged between the fifth switch and the sixth switch;
- a ninth node arranged between the third switch and the fourth switch;
- a tenth node arranged between the seventh switch and the eighth switch;
- an eleventh node arranged between the ninth switch and the tenth switch;
- a twelfth node arranged between the eleventh switch and the twelfth switch, the eleventh node and the twelfth node being connected to one another, wherein the first node and the third node are connected to a supply voltage, wherein the fifth node and the sixth node are connected to a reference voltage, wherein the fifth series circuit is connected at one end to the seventh node and at an opposite end to the eighth node, wherein the sixth series circuit is connected at one end to the ninth node and at an opposite end to the tenth node, and wherein the first contact terminal is connected to the second node and the second contact terminal is connected to the eleventh node.

3. The bridge circuit according to claim 2, further comprising:
- a seventh series circuit with a thirteenth switch and a fourteenth switch;
- a thirteenth node arranged between the thirteenth switch and fourteenth switch of the seventh series circuit; and
- an eighth series circuit with a fifteenth switch and a sixteenth switch;
- a fourteenth node arranged between the fifteenth switch and the sixteenth switch, wherein the seventh series circuit is connected at one end to the seventh node and at an opposite end to the eighth node, wherein the eighth series circuit is connected at one end to the ninth node and at an opposite end to the tenth node, wherein the thirteenth node and the fourteenth node are connected to one another, and wherein a load is connected to the thirteenth node.

4. The bridge circuit according to claim 3, wherein the load comprises a three-phase device.

5. The bridge circuit according to claim 3, wherein the load comprises an inductive load.

6. The bridge circuit according to claim 1, wherein, if the first switch, third switch, sixth switch or eighth switch fails in an open position, then the second switch, the fourth switch, the fifth switch or the seventh switch, respectively, maintains a switch function of the bridge circuit.

7. The bridge circuit according to claim 2, wherein, if the first switch, third switch, sixth switch or eighth switch fails in an open position, then the second switch, the fourth switch, the fifth switch or the seventh switch, respectively, maintains a switch function of the bridge circuit.

* * * * *